United States Patent [19]

Paoli

[11] Patent Number: 5,497,391
[45] Date of Patent: Mar. 5, 1996

[54] MONOLITHIC ARRAY OF INDEPENDENTLY ADDRESSABLE DIODE LASERS

[75] Inventor: Thomas L. Paoli, Los Altos, Calif.

[73] Assignee: Xerox Corporation, Stamford, Conn.

[21] Appl. No.: 308,877

[22] Filed: Sep. 19, 1994

Related U.S. Application Data

[63] Continuation of Ser. No. 49,898, Apr. 20, 1993, abandoned.

[51] Int. Cl.$^6$ ................................. H01S 3/18; H01S 3/25
[52] U.S. Cl. ............................................................ 372/50
[58] Field of Search ................................... 372/45, 46, 50, 372/48

[56] References Cited

U.S. PATENT DOCUMENTS

| | | | |
|---|---|---|---|
| 3,936,322 | 3/1976 | Blum et al. | 148/1.5 |
| 4,069,463 | 1/1978 | McGroddy et al. | 331/94.5 |
| 4,531,217 | 7/1985 | Kitamura | 372/50 |
| 4,870,652 | 9/1989 | Thornton | 372/50 |
| 4,916,710 | 4/1990 | Hattori | 372/50 |

FOREIGN PATENT DOCUMENTS

| | | | |
|---|---|---|---|
| 0214591 | 9/1986 | Japan | 372/46 |
| 0225985 | 10/1991 | Japan | 372/45 |
| 4188785 | 7/1992 | Japan | 372/46 |

OTHER PUBLICATIONS

H. C. Casey, Jr. and M. B. Panish, *Heterostructure Lasers Part B*, Academic Press, 1978 (No month available), pp. 207–217.

*Primary Examiner*—Rodney B. Bovernick
*Assistant Examiner*—Robert McNutt

[57] ABSTRACT

A monolithic array of two or more independently addressable, closely spaced diode lasers having low thermal, electrical, and optical crosstalk. An isolation region is formed between the adjacent laser elements, which are defined by rib loaded waveguides created by etching mesas above a planar active multilayer waveguide. Separate electrical connections to the ribs, and a common electrical connection to the substrate, enable individual addressing of each laser element. Selectively added blocking layers and/or insulating layers are added to the structure to provide improved electrical and/or thermal isolation.

16 Claims, 6 Drawing Sheets

MONOLITHIC ARRAY OF INDEPENDENTLY ADDRESSABLE DIODE LASERS

This is a continuation, of application Ser. No. 08/049,898, filed 20 Apr. 1993, now abandoned.

BACKGROUND OF THE PRESENT INVENTION

The present invention relates to the fabrication and design of arrays of closely spaced, independently addressable diode lasers having low electrical and thermal crosstalk.

BACKGROUND OF THE PRESENT INVENTION

Monolithic arrays of closely spaced, independently addressable semiconductor lasers are important optical sources for applications such as optical disk recorders, laser printers, and fiber optic communication systems. With such arrays it is generally desirable to pack the lasing elements as densely as possible. However, closely spaced lasing elements are difficult to electrically connect and heatsink (cool). Furthermore, closely spaced lasing elements tend to interact electrically, optically, and/or thermally, leading to undesirable crosstalk.

A partial solution to the crosstalk problem is disclosed in U.S. Pat. No. 4,069,463, issued 17 Jan. 1978 to McGroddy et. al. and entitled "Injection Laser Array." That patent teaches mounting each laser element in close electrical and thermal contact with a thermally and electrically conductive beam lead located in a substrate of insulating material. While the beam leads individually heatsink the laser elements, the beam leads are electrically isolated from each other. In the '463 patent, each laser element is defined and isolated from its neighbors by a groove through the epitaxial layers of the laser structure. Although the teachings of the '463 patent enable the fabrication of separately addressable and heatsinked laser elements, its successful implementation may be excessively complex.

Another partial solution to the crosstalk problems is taught in U.S. Pat. No. 4,531,217, issued 23 Jul. 1985 to Kitamura and entitled "Semiconductor Laser Device With Plural Light Sources." According to that patent, each laser element is mounted in close electrical and thermal contact with a common electrode on a homogeneous heatsinking submount. Physical separation of each laser element is provided by a groove through the substrate of the laser chip near the element's active layer. Each laser element is electrically addressed by individually contacting sections of the substrate between the grooves. Although this approach provides adequate heatsinking of the laser array, it does not provide adequate electrical isolation between adjacent laser elements due to the absence of isolation in the epitaxial layers.

U.S. Pat. No. 4,916,710, issued 10 Apr. 1990 to Hattori and entitled "Multi-Point Emission Type Semiconductor Laser Device Therefor," teaches using a groove to electrically isolating each laser element from its neighbors. The groove cuts through the epitaxial layers of the laser structure and into a previously formed protrusion on the laser's substrate. Since the substrate is insulating, the groove isolates each laser element. Electrical contact to the substrate side of each laser element is achieved by removing the nonprotruding regions of the substrate in order to access the first epitaxial layer, which is conducting. Electrical contact to the other side of each laser element is made with a single electrode that also serves as a heatsink. Although electrical isolation and heatsinking are both possible with this structure, an actual embodiment of the apparatus disclosed in the '710 patent is believed to be rather complicated and expensive since it requires a complex, specially prepared substrate. In addition, since the contact for each laser element on the substrate side must be large enough to accommodate the attachment of a wire, the required distance between protrusions increases the minimum separation between laser elements to an unacceptably large value if the array contains more than two elements. Finally, removing significant portions of the substrate, as required in the structure described in the '710 patent, weakens the structural integrity of the laser chip, thus making it susceptible to breakage.

Another approach to alleviating the complexities of electrically addressing closely spaced elements in a diode laser array is disclosed in U.S. Pat. No. 4,870,652, issued 26 Sep. 1989 to Thornton and entitled "Monolithic High Density Arrays of Independently Addressable Semiconductor Laser Sources." In the '652 patent, the substrate side of the array is attached to a submount, or directly to a mounting surface of the final package. With the laser chip orientated this way, the separate electrical contacts on the epitaxial layers of each laser element remain exposed and accessible for individual electrical connections. However, this approach provides relatively poor heatsinking through the substrate, and therefore requires exceptional laser performance. While such performance has been obtained with laser elements fabricated by impurity-induced layer disordering, it is not generally available with lasers utilizing other fabrication methods or designs. A consequence of the use of impurity-induced disordering is that the state of the art currently restricts its use to wavelengths longer than about 750 nm. Such wavelengths place undesirable limitations on the use of independently addressable laser arrays; for example, on the density with which data can be stored on optical disks or on the photoreceptive surfaces that can be used in laser printers.

Accordingly, there is a need for designs and fabrication techniques which enable low crosstalk in closely spaced (dense) arrays of diode lasers. Beneficially those designs and fabrication techniques should be applicable to laser arrays having elements which emit light with any wavelength, especially those shorter than about 750 nm.

SUMMARY OF THE INVENTION

The present invention enables monolithic arrays of closely spaced, independently addressable diode lasers having low thermal, electrical, and optical crosstalk by the use of an isolation region. According to one embodiment, an isolation region separates laser elements defined by rib-loaded waveguides formed by etched mesas above a planar active multilayer waveguide. In a second embodiment, the laser elements are defined and separated as in the first embodiment, but a blocking layer is selectively added around the mesas. In a third embodiment, the laser elements are defined and separated as in the second embodiment, but an additional contacting layer is formed over the blocking layer and over exposed tops regions of the mesas.

The isolation region is formed by modifying the planar active multilayers between the adjacent laser elements. Typical ways of forming the isolation region include ion implantation and intermixing of the active multilayers using layer disordering. The top surface of the resulting structure is beneficially planarized by filling around the laser elements and over the isolation region with an electrical and thermal insulator. Separate electrical contacts are formed over the laser elements, and a common return connection is made by an electrical contact on the substrate of the laser array. In practice, the length of the laser elements are chosen longer than about 300 µm, and the active layer is strained in order to lower the laser threshold current.

An aim of this invention is a monolithic linear array of closely spaced diode lasers that are independently addressable, and such that modulation of one laser element has a negligible effect on the other laser elements.

BRIEF DESCRIPTION OF THE DRAWINGS

In general, throughout the figures, like reference numerals denote like elements.

DETAILED DESCRIPTION OF THE ILLUSTRATED EMBODIMENTS

Figure 1:
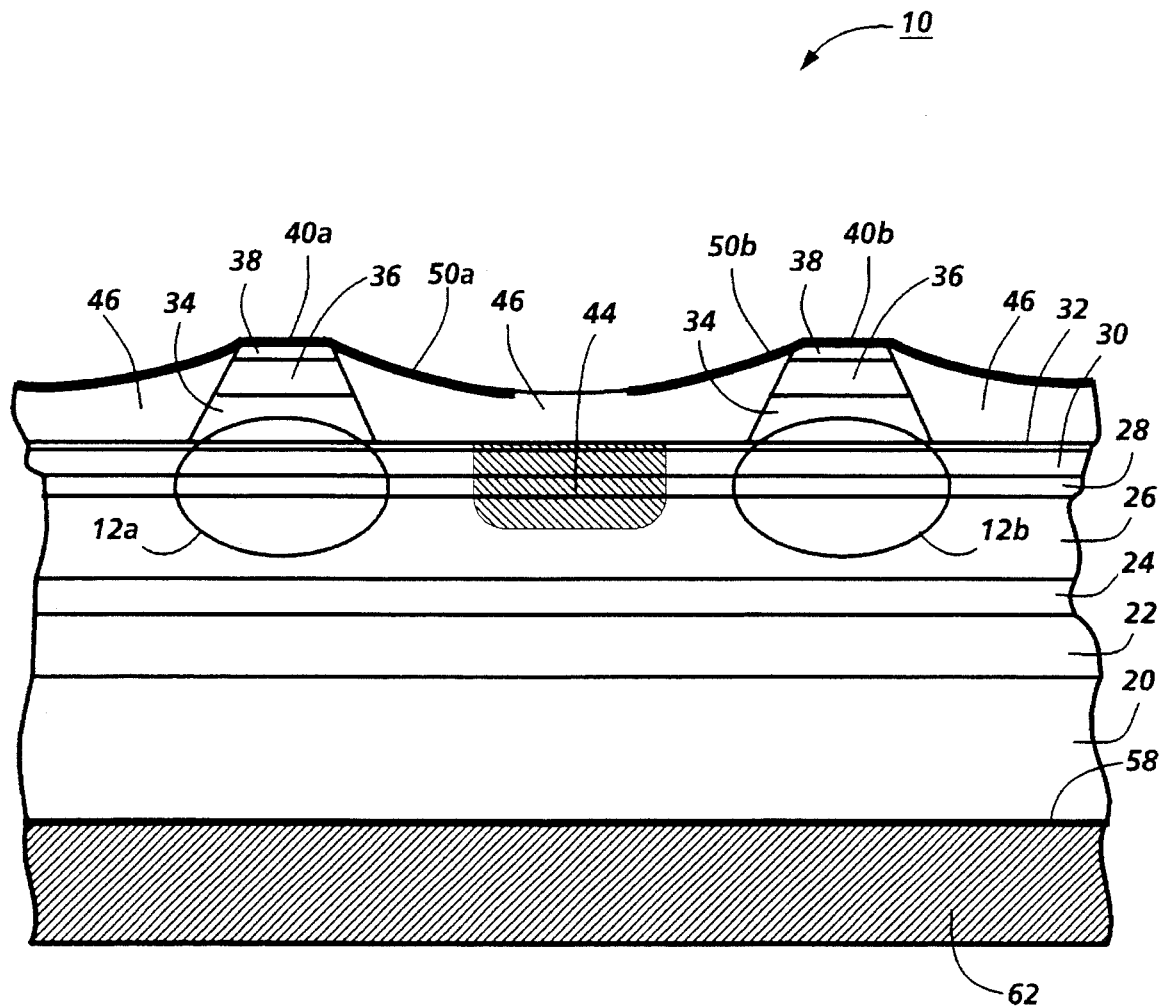
FIG. 1 is a cross-sectional view of a first embodiment semiconductor laser array having two laser elements.

FIG. 1 shows, in cross-section, a first embodiment semiconductor laser array 10 according to the present invention. The array 10 has two independently addressable semiconductor laser elements 12a and 12b. The array 10 includes: a substrate 20 of n-GaAs upon which is epitaxially deposited a buffer layer 22 of n-GaAs; a transition layer 24 of n-$Ga_{0.5}In_{0.5}P$; a cladding layer 26 of $Al_{0.5}In_{0.5}P$; an active waveguide multilayer 28 (preferably undoped); a partial top cladding layer 30 of p-$Al_{0.5}In_{0.5}P$; an ultrathin etch stop layer 32 of p-GaAs (or p-$Ga_{0.5}In_{0.5}P$); a partial top cladding layer 34 of p-$Al_{0.5}In_{0.5}P$; a transition layer 36 of p-$Ga_{0.5}In_{0.5}P$; and a cap layer 38 of p+GaAs.

The substrate 20 is beneficially misoriented with respect to its (100) direction in order to suppress spontaneous ordering of atomic planes during growth, thereby growing layers with the widest energy bandgap possible for their composition. The buffer layer 22 has a thickness in the range of 0.2 to 0.5 µm, the transition layer 24 has a thickness in the range of 0.1 to 0.3 µm, the cladding layer 26 has a thickness in the range of 0.5 to 1 µm, the cladding layer 30 has a thickness in the range of 0.2 to 0.4 µm, the etch stop layer 32 has a thickness in the range of 10 to 50 nm, the cladding layer 34 has a thickness in the range of 0.1 to 0.8 µm, the transition layer 36 has a thickness in the range of 0.1 to 0.5 µm, and the cap layer 38 has a thickness in the range of 20 to 100 nm.

The active waveguide multilayer 28 is comprised of a multiple (see below) quantum well heterostructure of active well layers of $Ga_yIn_{1-y}P$ or $(Al_xGa_{1-x})_yIn_{1-y}P$, separated by barrier layers of $(Al_{0.6}Ga_{0.4})_{0.5}In_{0.5}P$, and sandwiched between upper and lower carrier confinement layers of $(Al_{0.6}Ga_{0.4})_{0.5}In_{0.5}P$.

Further, the active waveguide multilayer 28 has N, 2 to 20 nm thick active quantum well layers that are separated by N-1, 10 to 30 nm thick barrier layers sandwiched between 100 to 200 nm thick carrier confinement layers. N, preferably between 1 and 5, is chosen to minimize the threshold current density and its variation with temperature. An exemplary embodiment has two 8 nm thick active quantum wells of $Ga_{0.4}In_{0.6}P$ (y=0.4) that are separated by a 12 nm thick barrier layer of $(Al_{0.6}Ga_{0.4})_{0.5}In_{0.5}P$, all sandwiched between 140 nm thick carrier confinement layers of $(Al_{0.6}Ga_{0.4})_{0.5}In_{0.5}P$. In this case y=0.4 is chosen to produce a compressively strained quantum well.

The laser elements 12a and 12b are defined by, respectively, ribs 40a and 40b. The ribs are formed by etching away layers 34, 36 and 38 until the etch stop layer 32 is reached. Between the laser elements is an isolation region 44 (subsequently discussed in more detail). An insulating layer 46, comprised of an electrically insulating material such as polyimide or $Si_3N_4$, is formed over the rest of the structure, except over the top of the ribs 40a and 40b. Separate electrical contacts 50a and 50b are then formed over the ribs.

In the array 10, the ribs 40a and 40b are between 2 and 4 µm wide and have a center-to-center spacing in the range of 10 to 100 µm. The isolation region 44 is greater than 2 µm wide. The maximum width of the ribs 40a and 40b is affected by the requirement that the laser emission be maintained in a fundamental spatial mode over the operating output power range.

To produce the laser array 10, a uniform epitaxial layer structure comprised of components 22 (the buffer layer) through 38 (the cap layer) is fabricated on a substrate 20. An opening where the isolation region 44 is to be formed is etched through the layers 38, 36, and 34 to the etch stop layer 32. The isolation region 44 is then formed within the opening, for example, by ion implantation or diffusion. Forming the isolation region 44 through the opening enables the isolation region to obtain the desired depth (see below). During ion implantation or diffusion, the other exposed surfaces are protected with an implantation or diffusion mask. After the isolation region 44 is formed, the ribs 40a and 40b are then defined by additional etching, during which the surface of the isolation region 44 is protected by an etch mask. Alternate procedures which produce similar ribs and isolation regions are also possible.

After the isolation region and ribs are formed, the insulating layer 46 is applied over the entire structure. Sections of the mask above the ribs are then removed to enable electrical contacts to be applied to the ribs. A uniform metal contact 58 is then applied to the substrate, and separated metal contacts 50a and 50b are applied to their respective ribs to provide individual addessability of the laser elements. As the array 10 is beneficially produced in large quantities on a semiconductor wafer, the wafer is broken into bars of laser arrays. The front and rear laser facets are coated and the bars are separated into individual arrays of two lasers. Each array is then packaged with its substrate attached to a mount 62, and wires (not shown) are then attached to the individual exposed electrical contacts.

The laser elements 12a and 12b are spaced apart such that they 1) are readily focused onto an image plane, and 2) permit substantially independent control over the power emitted by each element. The second factor implies that the crosstalk between elements in the laser array 10 is minimized. Features which help reduce the crosstalk include:

setting the center-to-center spacing between the elements to be the maximum allowed by the imaging optics used to form and manipulate the emitted laser beams;

choosing an isolation region width 44 that increases the optical, electrical, and thermal isolation between adjacent laser elements without substantially affecting their performance;

extending the depth of the isolation region 44 through the active layer 28 and into the first cladding 26 so as to block the electrical path between the laser elements;

growing the quantum well active layer so as to provide lasing emissions at the longest wavelength allowed by the photoreceptor used;

growing the quantum well active layer under compressive strain so as to achieve the lowest threshold density; and minimizing the temperature dependence of the lasing threshold density by:
  suppressing spontaneous order of atomic planes during growth of the layers in order to maximize their energy bandgap;
  applying a highly reflective coating to at least one facet of the laser cavity; and by
  fabricating the laser cavity to be longer than 300 μm.

A further reduction of the temperature sensitivity of the threshold current may be achieved by forming more than one quantum well in the active waveguide.

A laser array 10 which obtains crosstalk less than 4% is comprised of 500 μm long laser elements that are spaced about 25 μm apart. A 10 μm isolation region is centered with the 25 μm. The laser elements emit light of about 680 nm from a halfwave coated front facet. The rear facets are coated to reflect about 95% of the incident light. The active layer 28 has two quantum wells of compressively strained $Ga_{0.4}In_{0.6}P$.

As is well known, high resistivity regions can be created by implanting protons or oxygen ions into III-V semiconductor materials. Such implantations are used during fabrication of the isolation region 44. In the laser array 10, the implanted region extends at least through the active layer 28. Referring now to the laser array 100 of FIG. 2, the isolation region (item 144 in FIG. 2) preferably extends completely through the cladding layer 26. Implantation via an opening through the layers 38, 36, and 34 (as described above) allows the formation of isolation regions that extend to depths that would be difficult to reach by implanting through the layers 38, 36, and 34.

Figure 2:
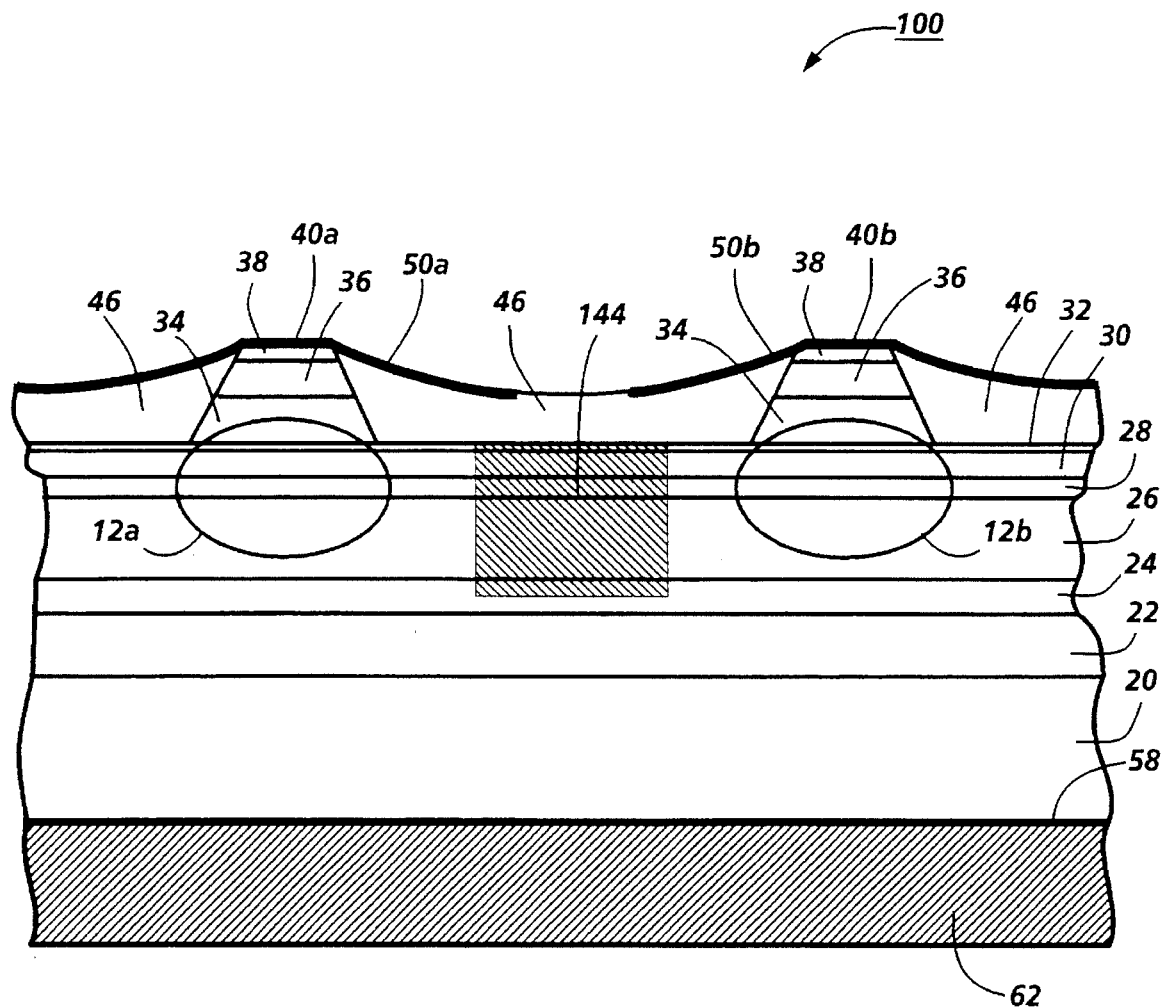
FIG. 2 is a cross-sectional view of the semiconductor array of FIG. 1, with the isolation region extending through the active multilayer.

Still referring to FIG. 2, because the implanted region 144 is highly nonconductive, the implanted region suppresses carrier diffusion in the active waveguide multilayer 28 and current flow in the partial cladding layer 30. When the center-to-center spacing of the laser elements 12a and 12b is greater than about 20 μm, the implanted region 144 can be chosen to be substantially narrower than the spacing between the laser elements in order to ensure that the lasing optical field is formed only by the loading of the mesas on the active waveguide multilayer 28. The optical absorption of the implanted region 144 blocks non-lasing light emitted by each laser element toward an adjacent element, thereby eliminating direct optical crosstalk. When the spacing between elements is narrowed to less than 20 μm, the implanted region 144 blocks leakage of the lasing field from one emitter to another as well as carrier diffusion. The deeper the implantation region goes, the better the electrical isolation between the lasing elements.

Figure 3:
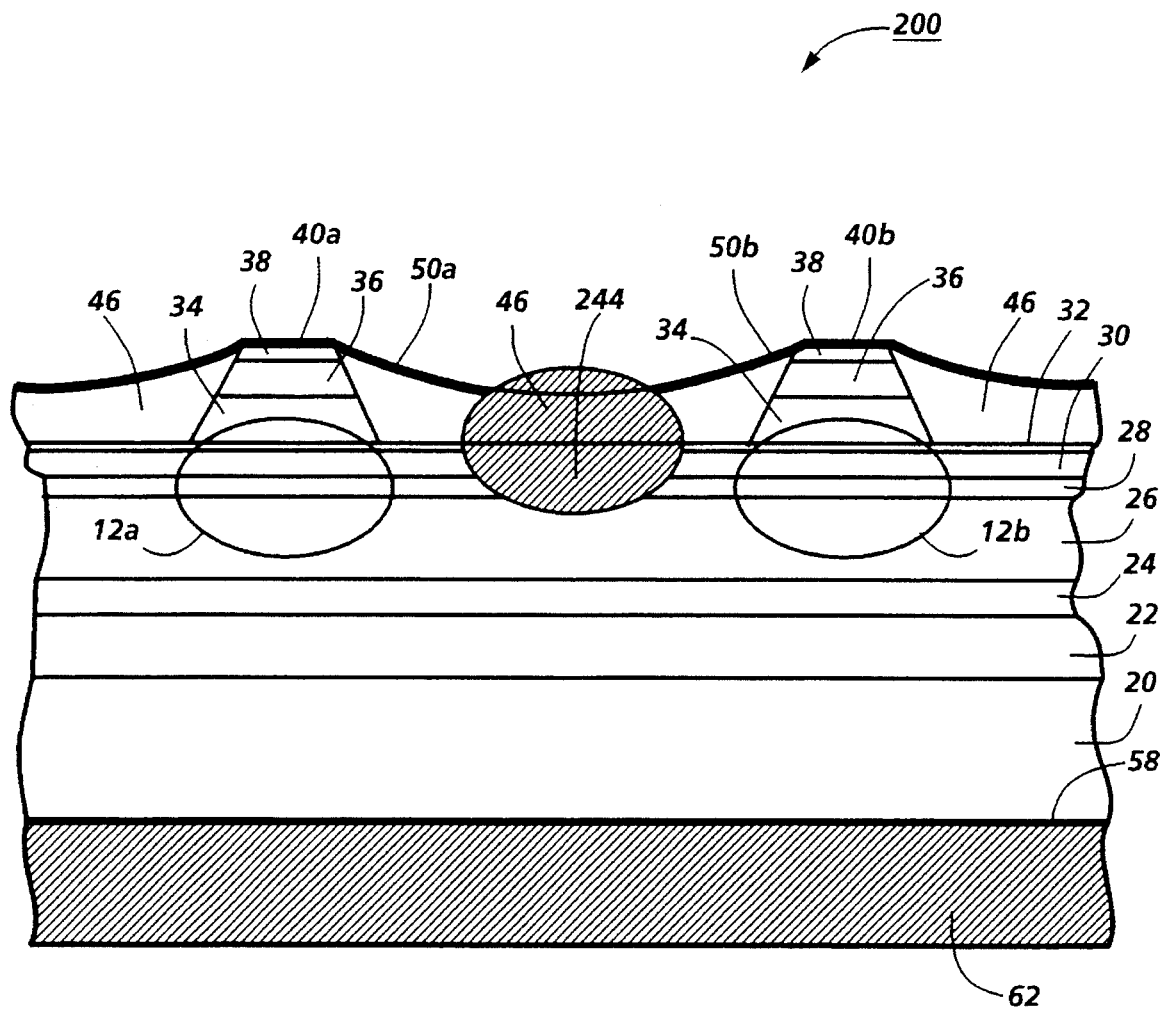
FIG. 3 is a cross-sectional view of the semiconductor array of FIG. 1, with the isolation region formed by diffusion.

FIG. 3 shows another laser array 200 according to the present invention. The laser array 200 includes an isolation region 244 that is formed by diffusion-induced layer intermixing. The intermixing, which involves layers 32, 30, 28, and part of layer 26, forms a region of intermediate composition having a bandgap larger than that of layers 32 and 28. Of course, alternative techniques which involve depositing or implanting sources of alternate atomic species, exist for accomplishing the intermixing process. However, the embodiment shown in FIG. 3 is produced by diffusing an impurity atom from a deposited source layer through an opening in a diffusion mask applied over the surface of the wafer. The diffusion mask can also be the etching mask used to open the windows in layers 38, 36, and 34. Diffusion via an opening substantially improves the reproducibility of the isolation region 244 as compared with diffusing through the layers 38, 36, and 34. After the isolation region 244 is formed, the ribs 40a and 40b are defined by etching, during which the surface of the isolation region 244 is masked. After formation of the isolation region and the ribs, the insulating layer 46 is applied over the entire structure. Further processing occurs as discussed in relation to FIG. 1.

If the etch stop layer 32 in FIG. 3 is GaInP, a suitable diffusion technique is to diffuse silicon from a P-rich source layer, as disclosed in U.S. Pat. No. 4,824,798, which is hereby incorporated by reference. If the etch stop layer 32 is GaAs, a good diffusion technique is to diffuse silicon from an As-rich source layer (see U.S. Pat. No. 4,824,798). A feature of the laser array 200 is that the GaAs etch stop layer is kept thinner than about 10 nm in order to suppress the formation of defects during intermixing, and to ensure that the GaAs layer is completely mixed with the layer 30.

The intermixed isolation region 244 provides electrical and optical isolation between adjacent laser elements, thereby suppressing crosstalk. The intermixed isolation region suppresses carrier diffusion in the active waveguide multilayer 28 since the isolation region's bandgap is wider than that of the active waveguide multilayer 28. Current flow between the adjacent laser elements in the partial cladding layer 30 is suppressed because injection into the isolation region 244 has a higher turn-on voltage than injection into active waveguide multilayer 28.

When the center-to-center spacing of the laser elements 12a and 12b is greater than about 20 μm, the intermixed isolation region 244 is chosen to be substantially narrower than the spacing between the laser elements in order to ensure that the lasing optical field is formed only by the loading of the mesa on the active waveguide multilayer 28. When the spacing between elements is less than 20 μm, the intermixed isolation region 244 also optically isolates adjacent emitters by blocking leakage of the lasing field between the emitters.

Figure 4:
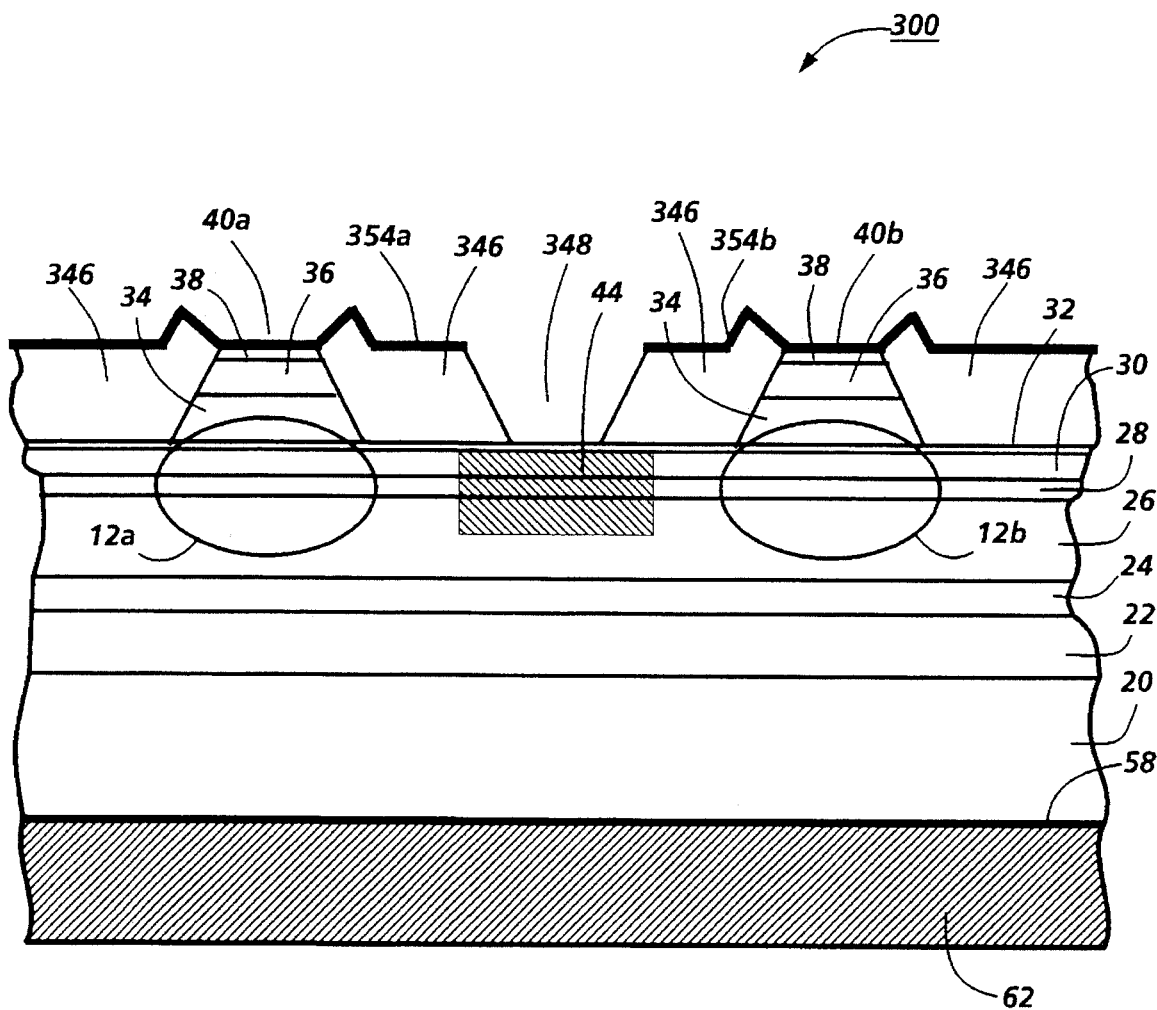
FIG. 4 is a cross-sectional view of a second embodiment semiconductor laser array having two laser elements.

FIG. 4 illustrates another laser array 300 according to the present invention. The laser array 300 is similar to the laser arrays 10 and 100, but it includes a blocking layer 346 of an n-type semiconductor such as GaAs, AlGaAs, or $Ga_{0.5}In_{0.5}P$, (see U.S. Pat. No 4,792,958). The laser array 300 is formed by first growing the epitaxial layers 22, 24, 26, 28, 30, 32, 34, 36, and 38 on the substrate 20. An opening is then etched through the layers 38, 36, and 34 and down to the etch stop layer 32. Again, the opening assists in the forming of the isolation region 44. After the isolation region 44 is formed, the ribs 40a and 40b are defined by etching; an etch mask is also placed over the surface of the isolation region 44. With the etch mask still in place the blocking layer 346 is selectively grown over the ribs 40a and 40b and the exposed etch stop layer 32. The etch mask prevents epitaxial growth on the top of the ribs and the isolation region. Epitaxial growth occurs on the exposed portions of the layers 32, 34, 36, and 38.

After growth of the blocking layer 346, the etch mask is removed from the top of the ribs. A metal contact 58 is formed on the substrate 20 and, using a photolithographic liftoff procedure, separated metal contacts 354a and 354b are applied over the top of the ribs and the blocking layer 346 to enable individual addessability of each laser element. The photolithographic liftoff procedure comprises the application of a liftoff mask to the top surface of the wafer. Removal of the liftoff mask leaves only the metal contacts 354a and 354b.

Final assembly of the laser array includes the steps of cleaving the wafer into bars, properly coating the front and rear laser facets, separating the bars into individual arrays of two lasers, packaging each array with its substrate attached to a mount 62, and attaching wires to the electrical contacts.

The isolation region 44 in FIG. 4 can be formed by either ion implantation or by layer intermixing. For layer intermixing, the preferred technique comprises diffusing a p-type dopant such as Zn (rather than the previously discussed n-type species) in order to form a p-n junction at blocking layer 346. This junction and the junction formed at the interface of the blocking layer 346 with the p-type layer 32 are reverse-biased when the laser active layer is forward-biased; this effectively channels current through the ribs 40a and 40b. However, the isolation region 44 can be formed with an n-type impurity such as silicon if a portion of the silicon diffused region is made non-conductive before the blocking layer 346 is overgrown. If the isolation region 44 is formed by ion implantation or by intermixing with a neutral species, electrons are not injected from the blocking layer 346 into the isolation region 44 because of its high resistivity; current is similarly channeled through the ribs.

The laser array 300 is advantageous because the blocking layer 346 increases the optical confinement of the laser mode, thereby enabling operation in a single spatial mode at higher power output than the laser array 10 (FIG. 1). Another advantage of the laser array 300 is that the blocking layer 346 provides structural protection for the ribs. However, the laser array 300 is more complex to fabricate since it requires an additional epitaxial growth step and more etching steps.

Figure 5:
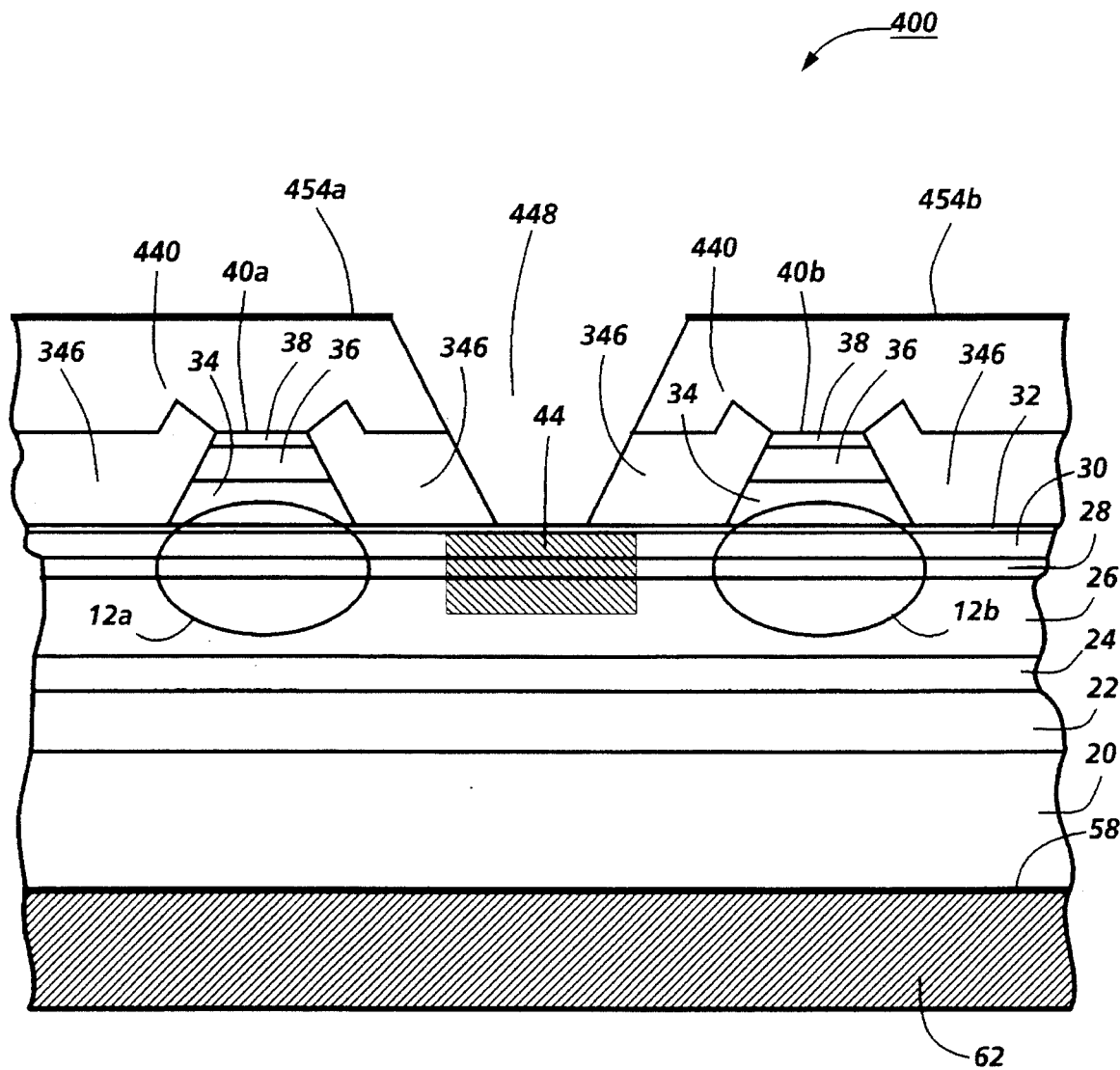
FIG. 5 is a cross-sectional view of a third embodiment semiconductor laser array having two laser elements.

FIG. 5 shows another laser array 400 according to the present invention. The laser array 400 is very similar to the laser array 300 (FIG. 4) except that the laser array 400 includes a contact layer 440 comprised of a p-type layer of GaAs (see U.S. Pat. No. 4,792,958). The laser array 400 is produced by first growing the epitaxial layers 22, 24, 26, 28, 30, 32, 34, 36, and 38 on the substrate 20. The isolation region 44 is then formed, and the ribs 40a and 40b are defined by etching. An n-type blocking layer 346 is then grown (as in the laser array 300). With the blocking layer 346 in place, the mask is removed from the tops of the ribs 40a and 40b, and the contact layer 440 is uniformly grown over both ribs. A metal contact 58 is then formed on the substrate, and the photolithographic liftoff procedure (previously discussed) is used to apply the metal contacts 454a and 454b. The laser array 400 is then packaged in the manner described above.

The laser array 400 is particularly advantageous for two reasons. First, the ribs 40a and 40b are protected beneath a layer of semiconductor material. Second, the increased contact area between the contacts 454a and 454b and the underlying semiconductor layer provides a lower contact resistance than the analogous contacts in the previous discussed laser arrays. However, the laser array 400 requires 3 epitaxial growths.

Figure 6:
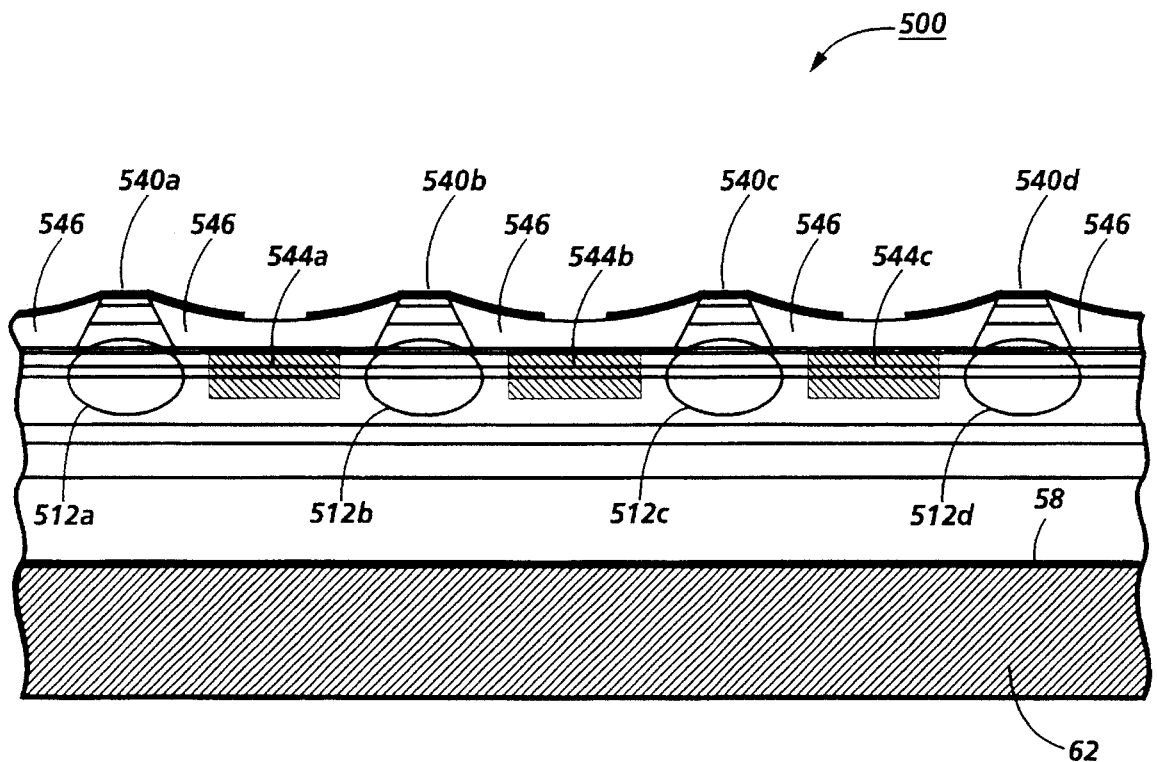
FIG. 6 is a cross-sectional view of a fourth embodiment semiconductor laser array having four laser elements.

The present invention is also applicable to monolithic laser arrays having more than two laser elements. For example, FIG. 6 shows a laser array 500 with four lasing elements, designated as laser elements 512a, 512b, 512c, and 512d. The constructions of those laser elements and the isolation regions 544a through 544c in the laser array 500 are substantially the same as corresponding structures in the laser array 10 (FIG. 1).

A problem with laser arrays of more than two laser elements is providing individual contacts to the closely spaced laser emitters while avoiding electrical and thermal crosstalk. Isolation is particularly difficult to achieve with the inner laser elements since their electrical connections cross over other laser elements. The laser array 500 incorporates one technique for achieving low crosstalk between elements with more than two closely spaced laser emitters.

In the laser array 500, after fabrication of the isolation regions 544a, 544b, and 544c, and the ribs 540a, 540b, 540c, and 540d, an insulating layer 546 is formed over the entire structure such that a substantially planar surface is formed. By uniformly etching this planar surface, contact windows are opened above the ribs 540a, 540b, 540c, and 540d. After opening the contact windows, most, but as is subsequently described, not all of the etching mask used to etch ribs 540a, 540b, 540c, and 540d is removed. Part of the etching mask remains in place to assist in forming a special contact pattern that permits independent addressing of the laser elements. This partial removal of the etching mask can alternatively be accomplished before the formation of insulating layer 546.

Figure 7:
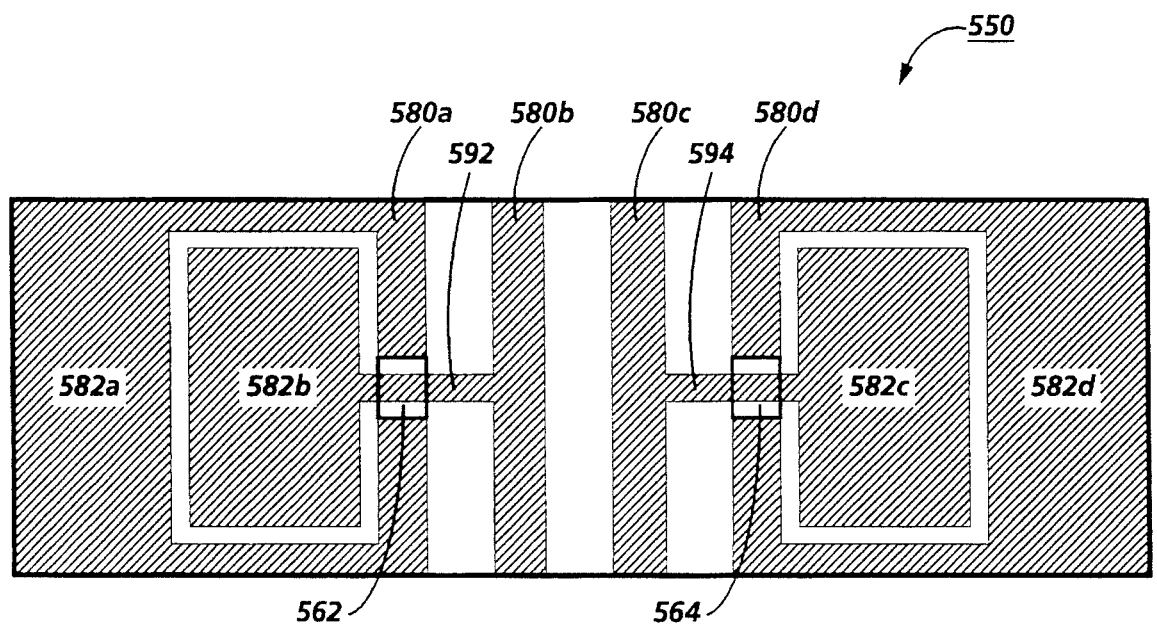
FIG. 7 shows the metal contact geometry for independently contacting and addressing the four laser elements of the embodiment of FIG. 6.

The special contact pattern 550, depicted in cross-hatching in FIG. 7, was disclosed in U.S. Pat. No. 4,870,652 to Thornton, which is hereby incorporated by reference. The previously mentioned etching mask that is not removed after the etching of the ribs is at the crossover regions 562 and 564. A liftoff mask is then placed over the insulating layer 546 and the ribs 540a–540d. The electrical contact pattern 550 is then formed by metalizing a Cr-Au bilayer over the liftoff mask. The liftoff layer is then removed, leaving the metallic layer shown in cross-hatch.

The resulting metalization pattern comprises four laser contacts 580a, 580b, 580c, and 580d for laser elements 512a, 512b, 512c, and 512d, respectively. The laser contacts 580a, 580b, 580c, and 580d have associated bonding pads 582a, 582b, 582c, and 582d, respectively, for attachment of external wires. The bonding pads may be placed on the insulating layer 546 or they may be placed on unetched regions of the layers 38, 36, and 34, which are either proton bombarded or covered with an insulating layer to electrically isolate the bonding pads from the underlying semiconductive layers. The outer bonding pads 582a and 582d connect to bifurcated contacts 580a and 580d, respectively. The inner bonding pads 582b and 582c connect, respectively, to the contacts 580b and 580c via metal connection bridges 592 and 594.

The connection bridges 592 and 594 are over the cross over regions 562 and 564, and are therefore insulated from the laser elements 512a and 512d by the remaining etching mask.

After the contacts 580a and 580d are formed, a metal contact 58 is formed on the substrate. The wafer upon which the structure has been formed is then cleaved into bars of laser arrays. The front and rear laser facets are then coated, the bars are separated into laser individual arrays 500 of four laser elements, and each laser array is packaged with its substrate attached to the mount 62. Finally, wires are attached to the exposed bonding pads 582a, 582b, 582c, and 582d.

Laser arrays having more than two elements can also be made using the technique described above with other laser elements, including those shown in FIGS. 4 and 5.

It is to be understood that the above described embodiments are illustrative examples which incorporate the present invention. Those embodiments are intended to be instructive, not limiting.

What is claimed is:

1. A monolithic semiconductor light emitting array, comprising:

a doped semiconductor substrate having a defined conductivity type, and having first and second surfaces;

a multilayer structure on said first surface of said doped semiconductor substrate, said multilayer structure including a first semiconductor confinement layer having a same conductivity type as said doped semiconductor substrate, a second semiconductor confinement layer having an opposing conductivity type than the conductivity type of said doped semiconductor substrate, and an etch stop layer, said multilayer structure further including an active semiconductor layer for generating light, said active layer being intervenient to said first and second semiconductor confinement layers and having a smaller bandgap than said first and second confinement layers;

a plurality of mesas, wherein each individual one of said plurality of mesas is disposed adjacent a first side of said etch stop layer;

a plurality of addressing electrodes, wherein each of said addressing electrodes is adjacent and in electrical communication with an associated individual one of said mesas;

an isolation region between two of said mesas, wherein said isolation region extends from the opposite side of said first side of said etch stop layer, and continues to extend through said second confinement layer, said active layer, and at least into said first confinement layer; and a common electrode on said second surface of said substrate, said common electrode for cooperating with each of said addressing electrodes to enable current flow through the mesa associated with each of said addressing electrodes.

2. The light emitting array according to claim 1, further including a thermal and electrical insulating layer adjacent said etch stop layer and between said mesas on said first side of said etch stop layer.

3. The light emitting array of claim 1, wherein said active layer comprises a material from the group consisting of $(Al_xGa_{1-x})_yIn_{1-y}P$ where $1 \geq x \geq 0$ and $1 \geq y \geq 0$.

4. The light emitting array according to claim 1, wherein said isolation region is formed by rendering portions of said second confinement layer and of said active layer electrically nonconductive.

5. The light emitting array according to claim 4, wherein said isolation region is formed by ion implantation.

6. The light emitting array according to claim 5, further including a thermal and electrical insulating layer adjacent said etch stop layer and between said mesas on said first side of said etch stop layer.

7. The light emitting array according to claim 1, wherein said isolation region is formed by layer disorder intermixing of said multilayer structure.

8. The light emitting array according to claim 7, further including a thermal and electrical insulating layer adjacent said etch stop layer and between said mesas on said first side of said etch stop layer.

9. A monolithic laser array, comprising:

a semiconductor substrate having a defined conductivity type and having first and second surfaces;

a multilayer structure on said first surface of said substrate, said multilayer structure including at least a first semiconductor confinement layer having a same conductivity type as said substrate, a second semiconductor confinement layer having the opposing conductivity type to said substrate, and an etch stop layer, said multilayer structure further including an active semiconductor layer for generating and propagating laser light, said active layer being intervenient to said first and second semiconductor confinement layers and having a smaller bandgap than said first and second confinement layers;

a plurality of mesas, wherein each one of said plurality of mesas is disposed adjacent a first side of said etch stop layer, said mesas for laterally forming the lasing optical field;

a plurality of addressing electrodes, wherein each of said addressing electrodes is adjacent and in electrical communication with an associated one of said mesas;

an isolation region between two of said mesas, wherein said isolation region extends from the opposite side of said first side of said etch stop layer, and continues to extend through said second confinement layer, said active layer, and at least into said first confinement layer; and a common electrode on said second surface of said substrate, said common electrode for cooperating with each of said addressing electrodes to enable current flow through the mesa associated with each of said addressing electrodes.

10. The laser array according to claim 9, further including a thermal and electrical insulating layer adjacent said etch stop layer and between said mesas on said first side of said etch stop layer.

11. The laser array of claim 9 wherein said active semiconductor layer comprises a material from the group consisting of $(Al_xGa_{1-x})_yIn_{1-y}P$, where $1 \geq x \geq 0$ and $1 \geq y \geq 0$.

12. The laser array according to claim 9, wherein said isolation region is formed by rendering portions of said second semiconductor confinement layer and of said active semiconductor layer electrically nonconductive.

13. The laser array according to claim 12, wherein said isolation region is formed by ion implantation.

14. The laser array according to claim 12, further including a thermal and electrical insulating layer adjacent said etch stop layer and between said mesas on said first side of said etch stop layer.

15. The laser emitting array according to claim 9, wherein said isolation region is formed by layer disorder intermixing of said multilayer structure.

16. The laser array according to claim 15, further including a thermal and electrical insulating layer adjacent said etch stop layer and between said mesas on said first side of said etch stop layer.

* * * * *